United States Patent
Ollila

(10) Patent No.: US 7,199,503 B2
(45) Date of Patent: Apr. 3, 2007

(54) ENERGY SAVING DRIVING CIRCUIT FOR PIEZOELECTRIC MOTOR

(75) Inventor: Mikko Ollila, Tampere (FI)

(73) Assignee: Nokis Corporation, Epsoo (FI)

( * ) Notice: Subject to any disclaimer, the term of this patent is extended or adjusted under 35 U.S.C. 154(b) by 0 days.

(21) Appl. No.: 11/150,835

(22) Filed: Jun. 10, 2005

(65) Prior Publication Data
US 2005/0285477 A1 Dec. 29, 2005

(30) Foreign Application Priority Data
Jun. 11, 2004 (FI) .................................. 20045218

(51) Int. Cl.
H01L 41/09 (2006.01)
H02N 2/06 (2006.01)

(52) U.S. Cl. .................... 310/317; 310/316.03

(58) Field of Classification Search ............. 310/317, 310/316.03, 318; 331/108 C, 116 R, 158
See application file for complete search history.

(56) References Cited

U.S. PATENT DOCUMENTS

| | | | |
|---|---|---|---|
| 4,044,297 A | 8/1977 | Nobue et al. | |
| 4,404,502 A | 9/1983 | Magori et al. | |
| 4,568,849 A | 2/1986 | Sato et al. | |
| 4,841,191 A | 6/1989 | Takada et al. | |
| 5,130,598 A | 7/1992 | Verheyen et al. | |
| 5,146,071 A * | 9/1992 | Ookubo et al. ......... | 250/201.2 |
| 5,633,579 A | 5/1997 | Kim | |
| 5,691,592 A | 11/1997 | Gunderson et al. | |
| 5,969,464 A | 10/1999 | Nakano et al. | |
| 6,563,251 B2 | 5/2003 | Jansson et al. | |
| 6,703,762 B1 | 3/2004 | Okada | |
| 2001/0035696 A1 | 11/2001 | Knowles et al. | |
| 2002/0113563 A1 | 8/2002 | Jansson et al. | |
| 2005/0029905 A1* | 2/2005 | Dal et al. .................... | 310/317 |
| 2005/0284443 A1* | 12/2005 | Huber et al. ................ | 123/299 |

FOREIGN PATENT DOCUMENTS

| | | |
|---|---|---|
| DE | 19858250 | 6/2000 |
| EP | 1001474 | 5/2000 |
| WO | WO 03104874 | 12/2003 |

OTHER PUBLICATIONS

"Efficient Charge Recovery Method for Driving Piezoelectric Actuators with Quasi-Square Waves;" Domenico Campolo et al.; IEEE transactions of Ultrasonics, Ferroelectrics, and Frequency Control, vol. 50, No. 3, Mar. 2003.

(Continued)

*Primary Examiner*—Darren E. Schuberg
*Assistant Examiner*—Derek Rosenau
(74) *Attorney, Agent, or Firm*—Ware, Fressola, Van Der Sluys & Adolphson LLP

(57) ABSTRACT

In a method and a device according to the present invention, two piezo-elements are driven with two voltages having a phase difference. One of the piezo-elements is charged by an inductive step-up means to a voltage exceeding an available power supply voltage. Subsequently charge, i.e. energy is transferred from the one piezo-element to the other piezo-element by an inductive element. The same inductive element is used in an inductive step-up means and in the transfer of the charge between the two piezo-elements.

16 Claims, 7 Drawing Sheets

OTHER PUBLICATIONS

"Energy Efficient Driving of Piezoelectric Actuators for the Micromechanical Flying Insect;" Domenico Campolo, Dec. 22, 2001; paragraph 4,2 and figures 4,9 and 4,10.

"New Approach to a Switching Amplifier for Piezoelectric Actuators;" H. Janocha et al.; ACTUATOR 98,6[Th] International Conference on New Actuators, Jun. 17 to 19, 1998, Bremen, Germany, pp. 189 through 192, entire document, figures 1 and 3.

* cited by examiner

ENERGY SAVING DRIVING CIRCUIT FOR PIEZOELECTRIC MOTOR

CROSS-REFERENCE TO RELATED APPLICATIONS

This application claims priority under 35 USC §119 to Finnish Patent Application No. 20045218 filed on Jun. 11, 2004.

FIELD OF THE INVENTION

The present invention relates to a piezo-element driving device and a method for driving piezo-elements, in which two piezo-element driving voltages are provided, said driving voltages being in different phases with respect to each other. The present invention relates also to a mobile device comprising a piezo-element driving device.

BACKGROUND OF THE INVENTION

Piezo-electric actuators are used in imaging systems to adjust the positions of zoom and focusing lens systems. Piezo-electric actuators are also used in other systems to move small objects. Driving devices providing suitable driving voltages are required to operate said piezo-electric actuators. Piezo-electric actuators are implemented by using one or more piezo-elements, which are deflected, expanded or contracted when coupled to an activating voltage.

Energy consumption related to the driving of piezo-elements is a problem especially in mobile systems. In mobile systems, the available power supply is typically a battery with a limited capacity. A piezo-element comprises a substantial internal capacitance and consequently it stores a certain amount of energy when it is coupled to a driving voltage. In order to improve the energy efficiency of a mobile device, it is advantageous to recover the capacitive energy stored in the piezo-elements.

Another aspect in mobile devices is that the voltage of an available power supply is typically lower than the optimum driving voltage of the piezo-elements. Driving voltages higher than the power supply voltage are typically generated using step-up means.

U.S. Pat. No. 6,563,251 discloses a driving device for an actuator having a capacitive motor phase, said driving device comprising a set of voltage sources, switching means connecting said voltage sources to said capacitive motor phase, one at a time, and a capacitive voltage step-up device, supporting or being itself said voltage sources.

The article "Efficient Charge Recovery Method for Driving Piezoelectric Actuators with Quasi-Square Waves", D. Campolo & al., IEEE Transactions on ultrasonics, ferroelectrics, and frequency control, Vol. 50 No. 3, March 2003, discloses a driving circuit for two piezo-elements, said driving circuit comprising an inductive element arranged to transfer a charge from a first piezo-element to a second piezo-element. The energy stored in the piezo-elements is partly recovered and re-used by means of said inductive element.

SUMMARY OF THE INVENTION

It is an object of the present invention to provide an energy-saving device and method for driving piezo-elements. A further object of the present invention is to provide a mobile device comprising an energy-saving piezo-element driving device.

According to a first aspect of the invention, there is a piezo-element driving device comprising at least:
a power input connectable to a power supply,
two outputs, said two outputs being connectable to at least two piezo-elements and arranged to provide two driving voltages with a mutual phase difference,
at least one inductive element,
switching means to couple said at least one inductive element between said outputs to transfer charge between said two outputs, and
at least one voltage step-up means to provide a voltage which is substantially higher than the voltage of said power input, wherein said at least one voltage step-up means is implemented using said at least one inductive element.

According to a second aspect of the invention, there is a method to drive a first piezo-element and a second piezo-element, said method comprising at least the steps of:
transferring a charge between said first piezo-element and said second piezo-element by coupling at least one inductive element between said first piezo-element and said second piezo-element, and
charging at least one of said first piezo-element and said second piezo-element by at least one voltage step-up means to a voltage which is substantially higher than the input voltage, wherein said at least one voltage step-up means is implemented using said at least one inductive element.

The devices and the method according to the present invention are used to provide at least two driving voltages for driving at least two piezo-elements, said driving voltages being in different phases with respect to each other. The devices and the method according to the present invention are mainly characterized in that an inductive element is used to transfer energy between said at least two piezo-elements, and that said inductive element is also used to provide a voltage which substantially exceeds the voltage of an available power supply voltage. In other words the piezo-element driving device according to the present invention comprises an inductive step-up means, which is implemented using said inductive element.

According to the present invention, piezo-elements can be operated with a good energy efficiency and using a low voltage power supply. The number of required inductive elements can be minimized. Consequently, also space requirements are reduced. Furthermore, the shielding of components against electromagnetic interference originating from the inductive elements becomes easier.

The embodiments of the invention and their benefits will become more apparent to a person skilled in the art through the description and examples given herein below, and also through the appended claims.

BRIEF DESCRIPTION OF THE DRAWINGS

In the following examples, the embodiments of the invention will be described in more detail with reference to the appended drawings, in which.

DETAILED DESCRIPTION OF THE INVENTION

Figure 1A:
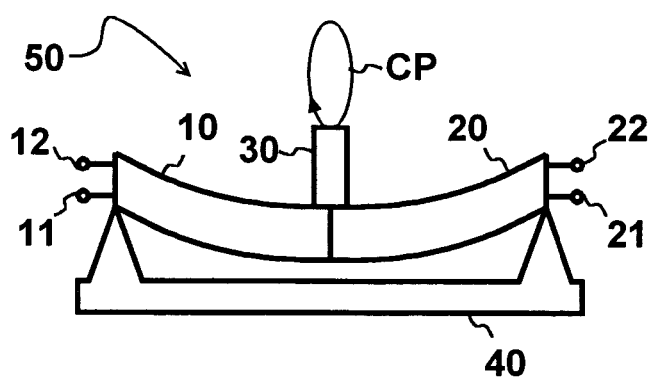
FIGS. 1a–1d show different operating phases of a piezoelectric actuator based on two independently deflectable piezo-elements.
Figure 1B:
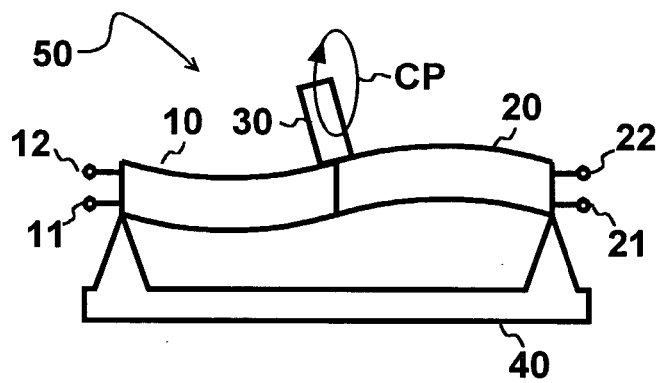
Figure 1C:
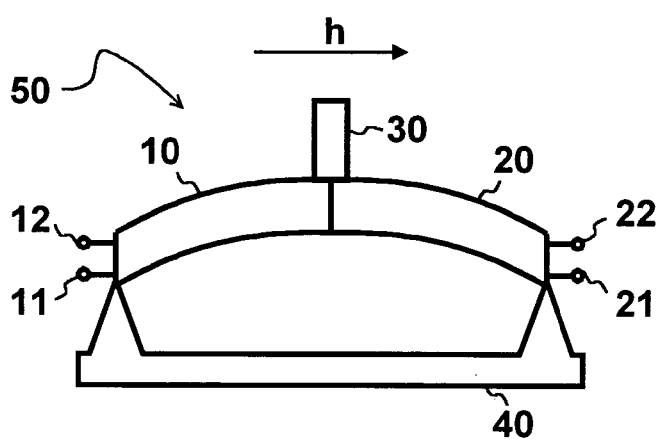
Figure 1D:
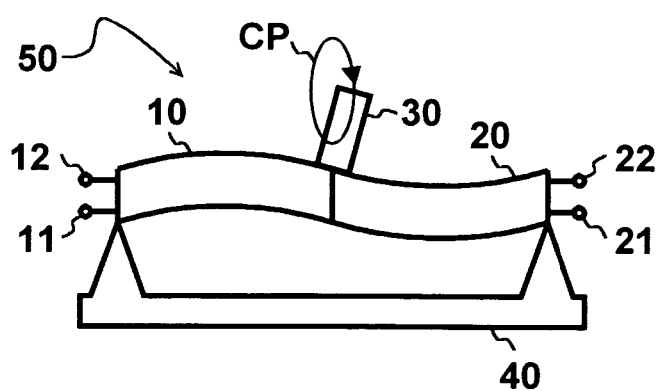

Referring to FIG. 1a, a piezo-electric actuator 50 may comprise two independently deflectable piezo-elements 10, 20, which have been connected together. A protrusion 30 is attached near the connection point of said two piezo-elements 10, 20. The piezo-elements 10, 20 are supported by a support 40, which allows the deflection of said piezo-elements 10, 20. The degree of deflection of each piezo-element 10, 20 is changed when a voltage is applied between voltage terminals 11,12, 21, 22 of said piezo-elements 10, 20. The piezo-elements 10, 20 may be designed and optimized to be operated using unipolar voltages, i.e. with voltages in the range from zero voltage to a maximum voltage. Preferably, the piezo-electric actuator 50 is implemented using deflectable piezo-elements known as bimorphs by the person skilled in the art.

The degree of deflection of said two piezo-elements is changed in a cyclic manner when alternating voltages are coupled to the voltage terminals 11, 12, 21, and 22. The tip of the protrusion 30 moves along a closed path CP when there is a phase difference between the alternating voltages coupled to the two piezo-elements. Preferably, the phase difference should be 90 degrees. FIGS. 1a to 1d illustrate four different operating phases of the actuator 50. The closed path CP has been omitted in FIG. 1c to avoid the blurring of the drawing. When the tip of the protrusion 30 is positioned near an object (not shown), it may contact said object at least in the phase shown in FIG. 1c, and moves said object to the direction h. The direction of the motion may be changed by reversing the sign of the phase difference, i.e. from 90 degrees to minus 90 degrees.

In an ideal case the driving waveforms would be sinusoidal. However, the piezo-elements 10, 20 are typically driven with voltages waveforms, which deviate considerably from the sinusoidal form. The phase difference may also deviate considerably from 90 degrees. The phase difference refers herein to a situation in which two voltages reach their maximum value and minimum values at different instants of time. It is emphasized, that the use of the expression phase difference does not require herein that the waveforms of said two voltages must be identical.

Figure 2:
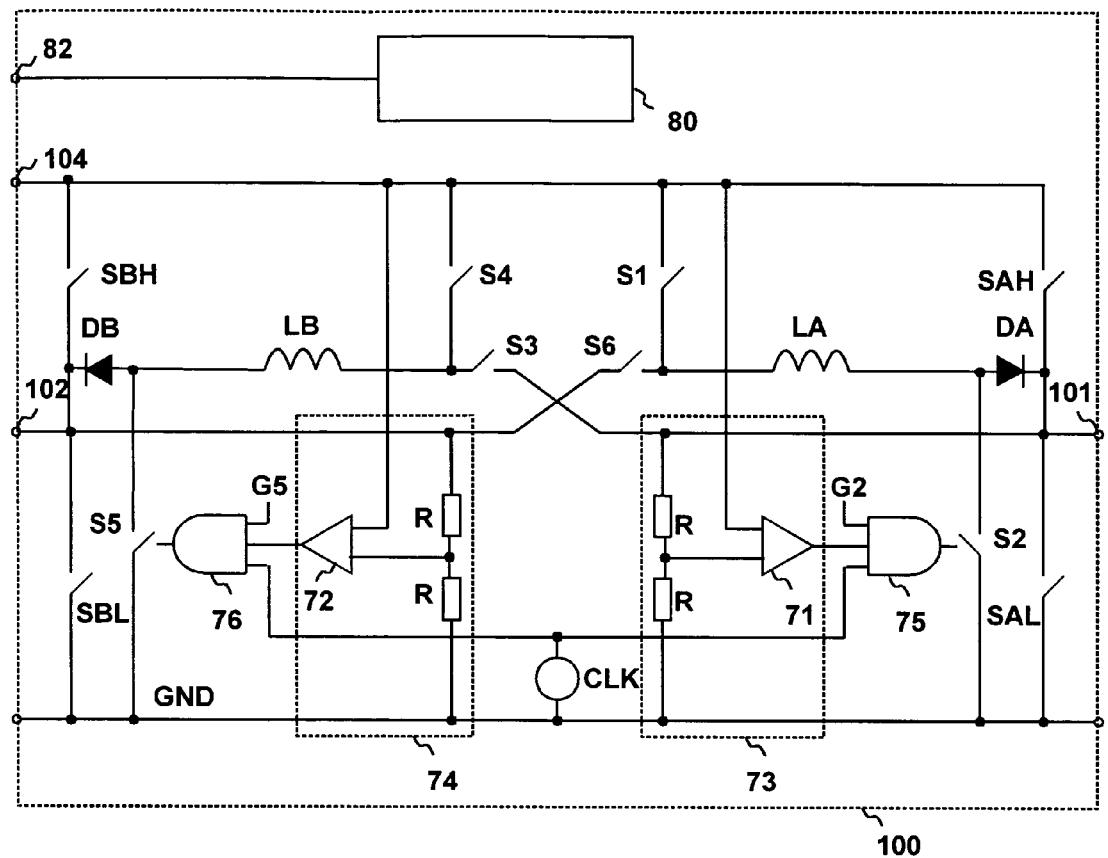
FIG. 2 shows the diagram of a piezo-element driving device according to the present invention.

Referring to FIG. 2, the piezo-element driving device 100 comprises a first inductive element LA, a second inductive element LB, a first comparator block 73, a second comparator block 74, ten switches S1, S2, S3, S4, S5, S6, SAH, SAL, SBH, SBL, a first diode DA, a second diode DB, a first three-input-AND-gate 75, a second three-input-AND-gate 76, a control logic 80 and a power input 104. The power input 104 is coupled to a power supply (not shown), which provides a voltage VS.

The control logic 80 controls the switches S1, S3, S4, S6, SAH, SAL, SBH, SBL. The control logic 80 is also coupled to the inputs G2 and G5 of the three-input-AND-gates 75, 76. The connections between the control logic 80, the switches S1, S3, S4, S6, SAH, SAL, SBH, SBL and the inputs G2, G5 are not shown in FIG. 2.

The first piezo-element 10 of the piezo-electric actuator 50 is coupled to a first output 101 and the second piezo-element of the piezo-electric actuator 50 is coupled to a second output 102. Each piezo-element 10, 20 constitutes a substantially capacitive load. However, due to losses and the actual work performed by the actuator 50, the load comprises also a resistive component. The inductance of the inductive element LA is preferably substantially equal to the inductance of the inductive element LB and the capacitance of the second piezo-element 20 is preferably substantially equal to the capacitance of the first piezo-element 10.

The comparator blocks 73, 74 are implemented using voltage dividers comprising resistors R and comparators 71 and 72. The comparator 73 is arranged to switch its output state from high to low when the voltage of the output 101 substantially exceeds two times VS. The comparator 74 is arranged respectively with regard to the second output 102.

Figure 3:
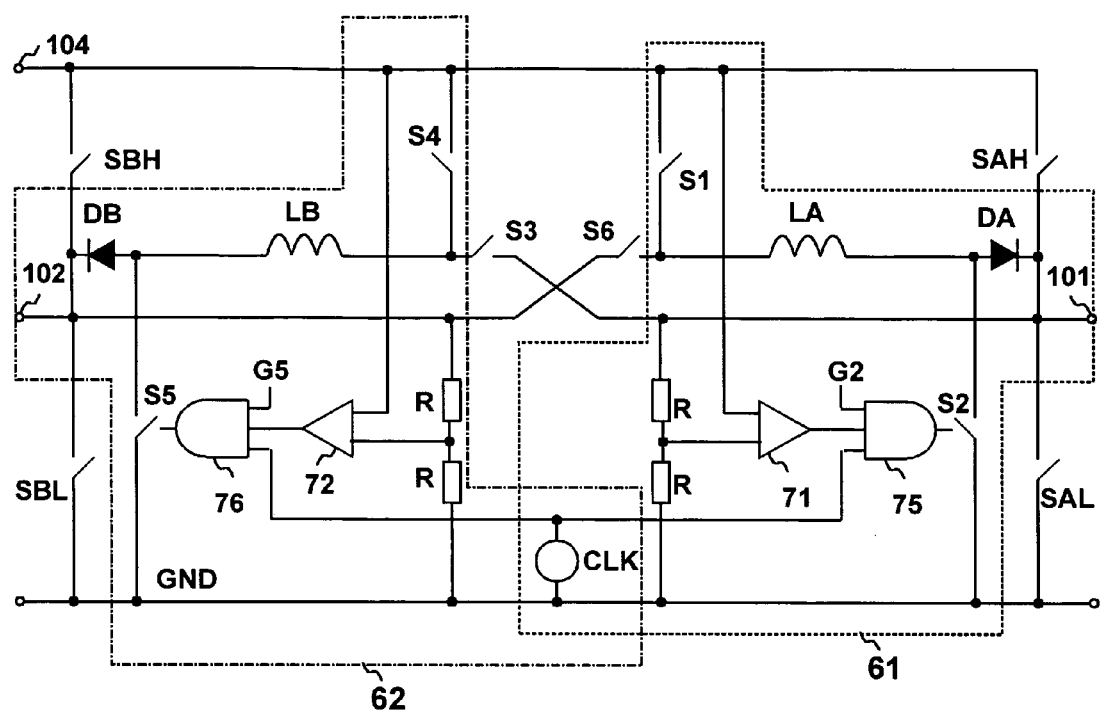
FIG. 3 shows the diagram of a piezo-element driving device according to the present invention, in which diagram inductive step-up means have been indicated.

Referring to FIG. 3, the piezo-element driving device 100 comprises also two inductive voltage step-up means 61, 62. The components constituting a first inductive step-up means 61 are enclosed by a dotted boundary. The first inductive step-up means 62 comprises the first inductive element LA, the diode DA, the comparator block 73, the three-input-AND-gate 75, the switch S2 and the clock CLK. The components constituting a second inductive step-up means 62 are enclosed by a dot-dash-line. The clock CLK is common to the both step-up means.

Figure 4:
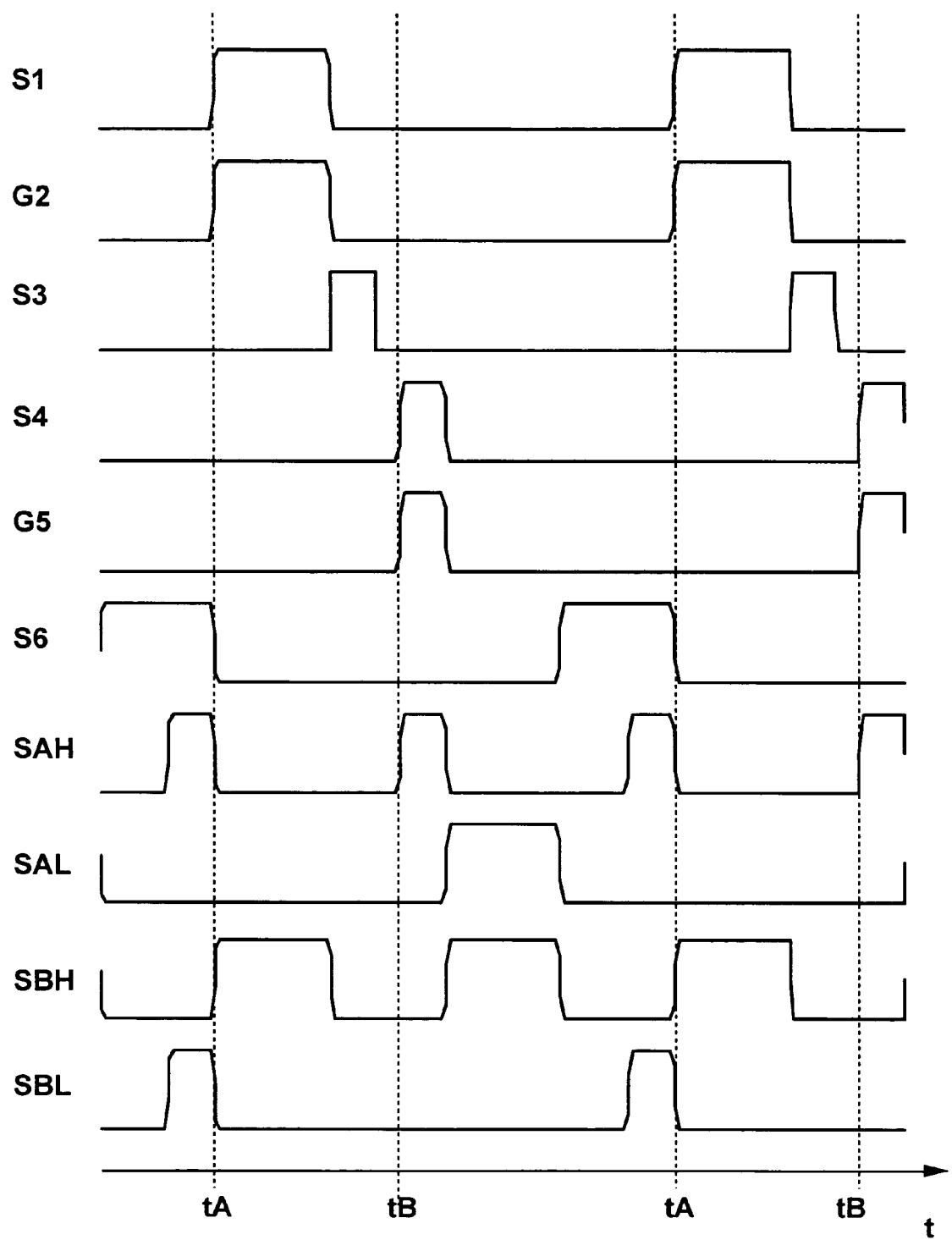
FIG. 4 shows by way of example the timing chart of the piezo-element driving device according to FIG. 2.

FIG. 4. shows the timing chart of the switches S1, S3, S4, S6, SAH, SAL, SBH and SBL. FIG. 4. shows also the timing chart of the input G2 of the three-input-AND-gate 75 and of the input G5 of the three-input-AND-gate 76. The curves exhibit two values: a high state and a low state. A high state is associated with a closed switch and a low state is associated with an open switch. In case of the gate inputs G2 and G5, the high state refers to the true state and the low state refers to the false state. The markings tA and tB indicate the starting times of the operation of the inductive stepping-up means 61, 62.

Figure 5:
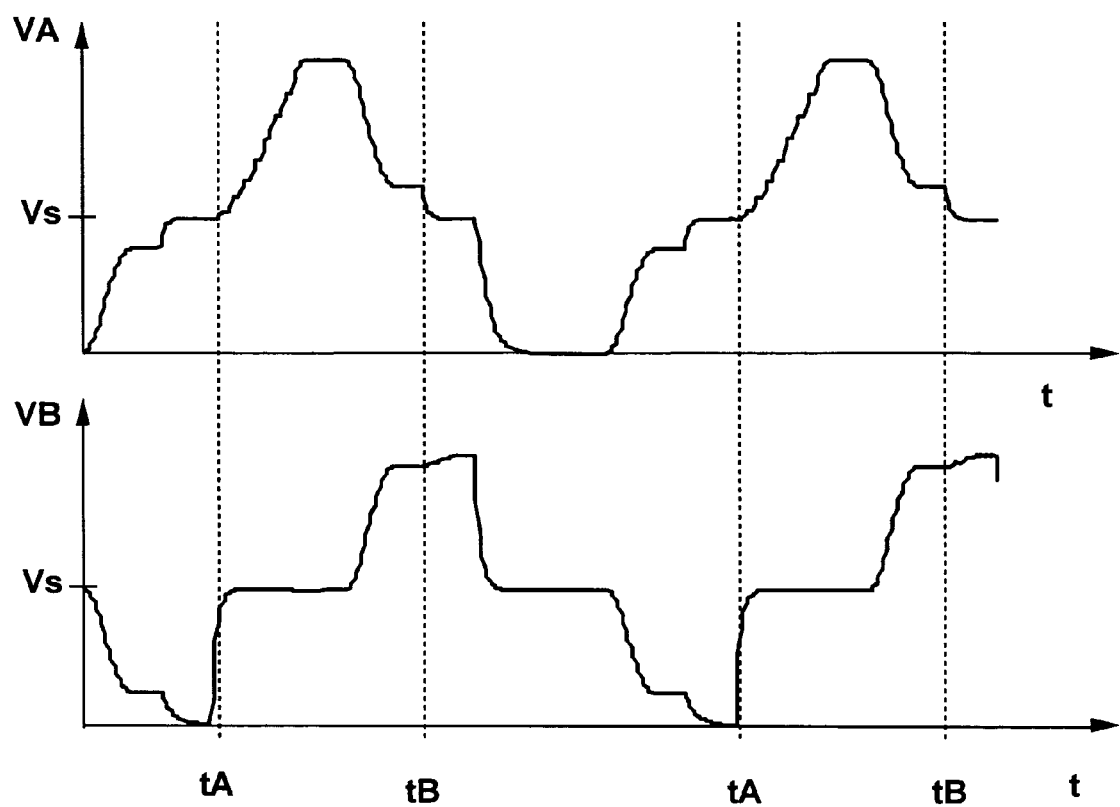
FIG. 5 shows by way of example the resulting voltage waveforms at the outputs of the piezo-element driving device according to FIG. 2.

FIG. 5. shows the resulting voltage waveforms at the outputs 101, 102 of the piezo-element driving device 100.

The operation of the piezo-element driving device 100 is now described referring to six operating steps, which are repeated in a cyclic way. Unless mentioned, the switches S1, S2, S3, S4, S5, S6, SAH, SAL, SBH, SBL are in the open (non-conducting) state.

In the first step the control logic 80 sends a command to close the switches SAH and SBL. The output 101 is thus coupled to the power supply voltage VS and the output 102 is coupled to the ground GND.

In the second step the control logic 80 closes the switches SBH and S1 and sets the input G2 of the first three-input-AND-gate 75 to the high state. The beginning of the second step is indicated by the marking tA in FIGS. 4 and 5. The switch SBH couples the second output 102 to the power supply voltage VS. The switch S2 is controlled by the first three-input AND-gate 75. The other inputs of said first three-input-AND-gate 75 are coupled to the first comparator 73 and to the clock CLK. The voltage of the first output 101 is substantially lower than two times VS, and consequently the switch S2 opens and closes several times following the state of the clock CLK. When the switch S2 is closed, the first inductive element LA is coupled between the power input 104 and the ground GND, and energy is stored in the magnetic field in said first inductive element LA. When the switch S2 opens, the energy is transferred from the first inductive element LA to the first piezo-element 10. Consequently, the voltage of the first output 101 is increased. The diode DA prevents the discharging of the first inductive element 10. The switch S2 is opened and closed several times until the first comparator block 73 detects that the voltage of the first output 101 has substantially reached a voltage, which is two times VS. In other words, a piezo-element driving voltage substantially higher than the power supply voltage VS is generated. In the end of the second step the voltage of the second output 102 is still equal to VS.

In the 3rd step the control logic closes the switch S3, which couples the second inductive element LB between the first piezo-element 10 and the second piezo-element 20. There is an initial voltage difference between the first output 101 and the second output 102, said voltage difference being substantially equal to VS. Charge is transferred from the first piezo-element 10 to the second piezo-element 20 through the switch S3, the second inductive element LB and the second diode DB. Basic circuit theory shows that after a time period τ, the voltages of the two outputs 101 and 102 are reversed, assuming that the internal capacitances of the piezo-elements 10, 20 are substantially equal. The time period τ is given by $$\tau = \sqrt{LC/8}, \quad (1)$$

in which L is the inductance of the inductive elements LA, LB and C is the capacitance of the piezo-elements 10, 20. In an ideal case and after the time period τ, the voltage at the first output 101 is near VS and the voltage at the second output 102 is near two times VS. In reality the reached voltages deviate from the ideal values for example due to the voltage drop over the diode and the losses in the switch S3.

In the fourth step the voltage deviations are remedied. The beginning of the fourth step is indicated by the marking tB in FIGS. 4 and 5. The switch S4 is closed and the gate input G5 is set to the high state to start the operation of the second stepping-up means 62. The second stepping-up means 62 operates until the voltage of the second output 102 substantially reaches two times VS. The first output 101 is also coupled to the power supply voltage VS by the switch SAH.

In the fifth step the switch SAL is closed and the first output 101 is coupled to the ground GND, i.e. the voltage of the first output 101 becomes zero. Also the switch SBH is closed and the second output 102 is coupled to the power supply voltage VS.

In the sixth step, the switch S6 is closed, and charge is transferred from the second piezo-element 20 to the first piezo-element 10. After a time period τ, the voltage of the second output 102 is near zero and the voltage of the first output 101 is near the power supply voltage VS. However, there is a voltage deviation due to losses.

Now, the cycle described above repeats itself starting again from the first step, in which the first output 101 is again coupled to the power supply voltage VS by the switch SAH and the second output 102 is coupled to the ground GND by the switch SBL.

The direction of movement associated with the operation of the piezo-electric actuator 50 can be reversed by repeating the above-mentioned six steps, but replacing the role played by the switch S1 with role played by the switch S4, and replacing the role played by the switch S4 with role played by the switch S1. Further, the roles of the switches S3 and S6, of the switches SAH and SBH, of the switches SAL and SBL, and of the signals G2 and G5 should also be interchanged, respectively.

Preferably, the comparators 73, 74 are implemented in such a way that they exhibit hysteresis. Said hysteresis is advantageous because it reduces switching noise and electromagnetic interference.

In practise, the power supply voltage VS may be rather noisy. Therefore an advantageous option is to use a further device to provide the required reference voltage for the comparator blocks 73, 74. For example, a bandgap voltage reference may be used to provide the reference voltage.

The switches, comparators, three-input-AND-gates, the clock and the control logic may be implemented using various semiconductor-based technologies and devices known by the person skilled in the art. The switches may be implemented using, for example, metal oxide semiconductor field effect transistors or bipolar transistors.

The timing of the switches may be optimized according to the intended speed of the piezo-electric actuator 50. The control logic 80 may also monitor the voltages of the outputs 101, 102 in order to optimize the timing of the switches according to the response of the piezo-elements.

Figure 6:
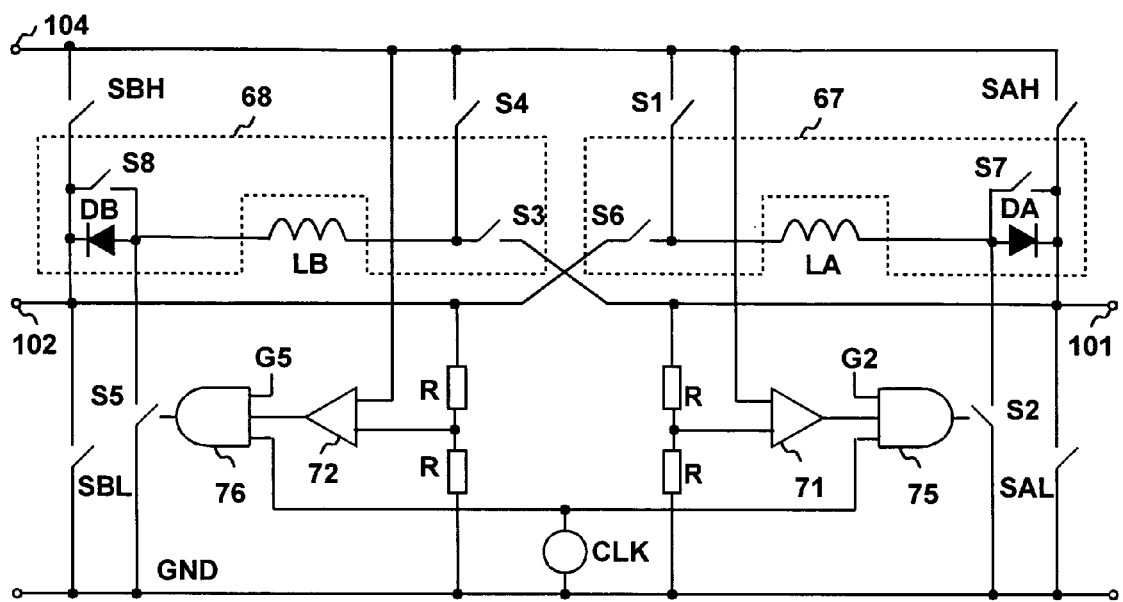
FIG. 6 shows the diagram of a piezo-element driving device according to the present invention, in which diagram switching means coupling inductive elements between the outputs of the piezo-element driving device have been indicated.

Referring to FIG. 6, the inductive elements LA, LB are coupled between the outputs 101, 102 by the switching means 67, 68. The switching means 67 comprises the switch S3 and the diode DA. The switching means 68 comprises the switch S6 and the diode DB, respectively. In a further embodiment, also further switches S7, S8 may be used to bypass the diodes DA, DB during the third and the sixth operating steps during which charge is transferred between the piezo-elements 10, 20. The advantage is that the use of the further switches S7, S8 reduces voltage losses and energy dissipation.

Figure 7:
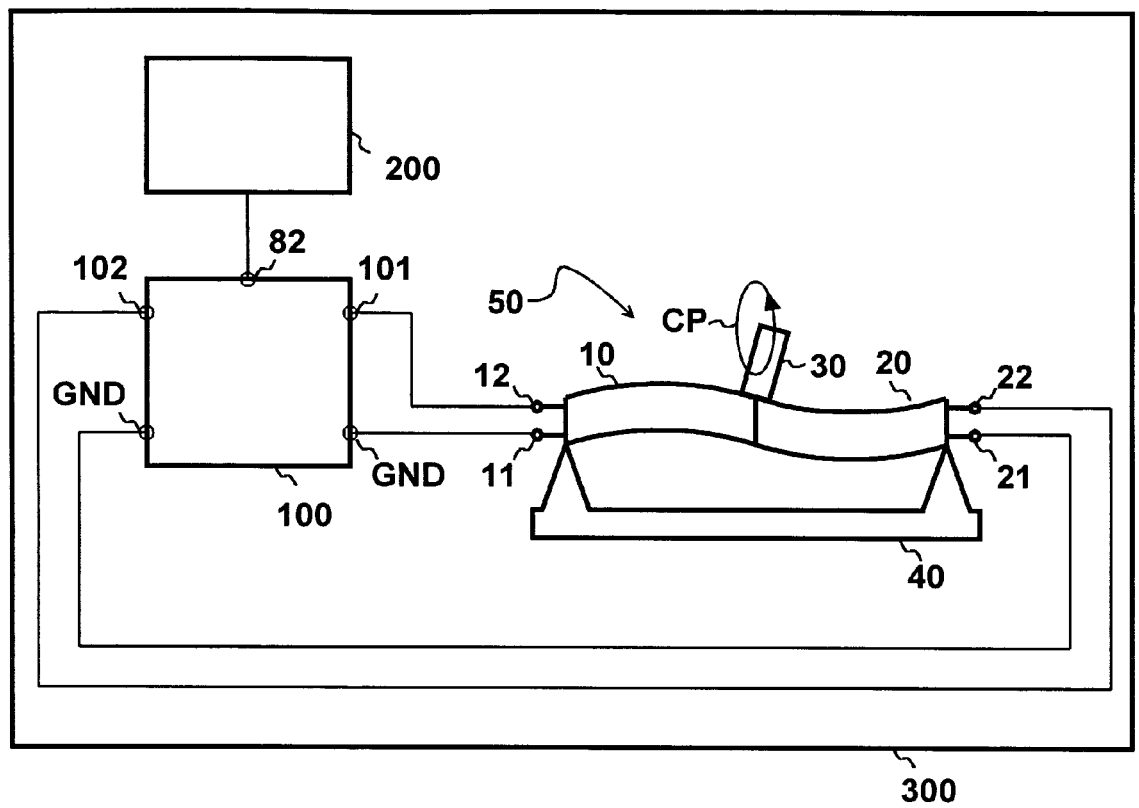
FIG. 7 shows a mobile device comprising a piezo-element driving device according to the present invention.

Referring to FIG. 7, the piezo-element driving device 100 may be used in a mobile device 300, in which a piezo-element driving circuit 100 is connected to a piezo-actuator 50. The piezo-actuator is preferably implemented using bimorphs in a way described in the patent application PCT/US03/17611. A control unit 200 is coupled to the control logic input 82 to control the direction and the speed of the actuator 50. The mobile device 300 may be for example a portable optical imaging system. In that case the mobile device 300 may comprise several piezo-element driving circuits 100 and piezo-actuators 50 to adjust the positions of several lens systems and optical components, in order to adjust the image magnification (zoom), the focus distance and the aperture of said portable optical imaging system. The use of the piezo-element driving circuit 100 according to the present invention is especially advantageous in mobile devices 300, because the piezo-elements 10, 20 can be driven at a voltage, which exceeds the available power supply voltage, energy is saved and the number of inductive elements (LA, LB) is minimized.

The use of the piezo-element driving device 100 and the method according to the present invention is not limited to the driving of deflectable piezo-elements but may also be applied to drive expanding and contracting piezo-elements such as disclosed, for example, in U.S. Pat. No. 6,703,762.

For the person skilled in the art, it will be clear that modifications and variations of the device and method according to the present invention are perceivable. The particular embodiments described above with reference to the accompanying drawings and tables are illustrative only and not meant to limit the scope of the invention, which is defined by the appended claims.

What is claimed is:

1. A piezo-element driving device comprising:
a power input connectable to a power supply,
a first output connectable to a first piezo-element and arranged to provide a first driving voltage,
a second output connectable to a second piezo-element and arranged to provide a second driving voltage, said second driving voltage having a maximum voltage, said driving voltages having a mutual phase difference,
at least one inductive element,
a first switching module configured to couple said at least one inductive element between said outputs to transfer charge between said two outputs, and
at least one voltage step-up module configured to provide a charging voltage to at least one of said first piezo-element and said second piezo-element, which charging voltage is substantially higher than the voltage of said power input,
said at least one voltage step-up module being implemented using said at least one inductive element, and
a second switching module configured to discharge said second piezo-element from said maximum voltage such that said at least one inductive element is disconnected from between said first output and said second output during said discharging.

2. The device according to claim 1, wherein said first switching module further comprises at least one diode coupled in series with said at least one inductive element and a further switch arranged to bypass said at least one diode during said transfer of charge between said two outputs.

3. The device according to claim 1, wherein the number of said at least one inductive elements is two.

4. The device according to claim 1, wherein said inductive step-up module comprises at least a switch to connect said at least one inductive element to ground, said switch being controlled by an AND-gate with three inputs, the inputs of said AND-gate being coupled to a clock, to a comparator and to a control logic, said comparator being arranged to stop the operation of said inductive step-up module when the voltage of said output reaches a predetermined target voltage.

5. The device according to claim 4, wherein said comparator is arranged to exhibit hysteresis, when the voltage of said output is substantially in the vicinity of said predetermined target voltage.

6. A method comprising:
driving a first piezo-element with a first driving voltage and driving a second piezo-element with a second driving voltage, said second driving voltage having a maximum voltage, said driving voltages having a mutual phase difference,
transferring a charge between said first piezo-element and said second piezo-element by coupling at least one inductive element between said first piezo-element and said second piezo-element, and
charging at least one of said first piezo-element and said second piezo-element by at least one voltage step-up module to a voltage which is substantially higher than an input voltage associated with said charging,
wherein said at least one voltage step-up module is implemented using said at least one inductive element, and
discharging said second piezo-element from said maximum voltage such that said at least one inductive element is disconnected from between said second piezo-element and said first piezo-element during said discharging.

7. The method according to claim 6, wherein said at least one inductive element is connected in series with a diode, which diode is bypassed during said transfer of charge by a further switch.

8. The method according to claim 6, wherein the number of said at least one inductive elements is two.

9. The method according to claim 6, wherein said inductive step-up module comprises at least a switch to connect said at least one inductive element to ground, said switch being controlled by an AND-gate with three inputs, the inputs of said AND-gate being coupled to a clock, to a comparator and to a control logic, said comparator being arranged to stop the operation of said inductive step-up module when the voltage of said inductive step-up module reaches a predetermined target voltage.

10. The method according to claim 9, wherein said comparator exhibits hysteresis when the voltage of said inductive step-up module is substantially in the vicinity of said predetermined target voltage.

11. A device comprising at least one piezo-element driving device and at least one piezo-electric actuator, said piezo-element driving device in turn comprising:
a power input connectable to a power supply,
a first output connectable to a first piezo-element and arranged to provide a first driving voltage,
a second output connectable to a second piezo-element and arranged to provide a second driving voltage, said second driving voltage having a maximum voltage, said driving voltages having a mutual phase difference,
at least one inductive element,
a first switching module configured to couple said at least one inductive element between said outputs to transfer charge between said two outputs, and
at least one voltage step-up module configured to provide a charging voltage to at least one of said first piezo-element and said second piezo-element, which charging voltage is substantially higher than the voltage of said power input,
wherein said at least one voltage step-up module being implemented using said at least one inductive element, and
a second switching module configured to discharge said second piezo-element from said maximum voltage such that said at least one inductive element is disconnected from between said first output and said second output during said discharging.

12. The device according to claim 11, wherein said device is a mobile device.

13. The device according to claim 11, wherein said at least one piezo-electric actuator comprises at least two bimorphs.

14. The device according to claim 11, wherein said at least one piezo-electric actuator is arranged to adjust the position of a focusing or zoom lens system.

15. A piezo-element driving device comprising:
means for connecting to a power supply,
a first output means, connectable to a first piezo-element, for providing a first driving voltage,
a second output means, connectable to a second piezo-element, for providing a second driving voltage, said second driving voltage having a maximum voltage, said driving voltages having a mutual phase difference,
at least one inductive element,
a first switching means for coupling said at least one inductive element between said first and second output means to transfer charge between said first and second output means, and
at least one voltage step-up means for providing a charging voltage to at least one of said first piezo-element and said second piezo-element, which charging voltage is substantially higher than the voltage of said power supply, said at least one voltage step-up means being implemented using said at least one inductive element, and a second switching means for discharging said second piezo-element from said maximum voltage such that said at least one inductive element is disconnected from between said first output means and said second output means during said discharging.

16. The device according to claim 15, wherein said first switching means further comprises at least one diode coupled in series with said at least one inductive element and a further switch arranged to bypass said at least one diode during said transfer of charge between said first and second output means.

* * * * *

UNITED STATES PATENT AND TRADEMARK OFFICE
CERTIFICATE OF CORRECTION

PATENT NO. : 7,199,503 B2  
APPLICATION NO. : 11/150835  
DATED : April 3, 2007  
INVENTOR(S) : Ollila Page 1 of 1

It is certified that error appears in the above-identified patent and that said Letters Patent is hereby corrected as shown below:

Title Page item 73
1. Assignee: "Nokis" should be -- Nokia --
2. Assignee: "Epsoo" should be -- Espoo --

Signed and Sealed this

Tenth Day of June, 2008

JON W. DUDAS  
*Director of the United States Patent and Trademark Office*